US010691171B2

(12) United States Patent
Kang et al.

(10) Patent No.: US 10,691,171 B2
(45) Date of Patent: Jun. 23, 2020

(54) ELECTRONIC DEVICE

(71) Applicant: SAMSUNG ELECTRONICS CO., LTD., Suwon-si, Gyeonggi-do (KR)

(72) Inventors: Kyong Rok Kang, Suwon-si (KR); Dong Hun Kim, Seoul (KR); Jong Kon Bae, Seoul (KR); Jung Chul An, Yongin-si (KR); Joung Min Cho, Seoul (KR); Kwang Tai Kim, Yongin-si (KR); Hyung Sup Byeon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 7 days.

(21) Appl. No.: 15/861,964

(22) Filed: Jan. 4, 2018

(65) Prior Publication Data

US 2018/0196476 A1 Jul. 12, 2018

(30) Foreign Application Priority Data

Jan. 9, 2017 (KR) .................. 10-2017-0002748

(51) Int. Cl.
*G06F 1/16* (2006.01)
*G06F 3/041* (2006.01)
*H01L 27/32* (2006.01)

(52) U.S. Cl.
CPC .......... *G06F 1/1647* (2013.01); *G06F 1/1643* (2013.01); *G06F 1/1656* (2013.01); *G06F 3/0412* (2013.01); *H01L 27/3267* (2013.01)

(58) Field of Classification Search
CPC ....... G06F 1/1647–1649; G02F 1/1333; G02F 2001/133342; H01L 27/3267
See application file for complete search history.

(56) References Cited

U.S. PATENT DOCUMENTS 8,947,866 B2 2/2015 Jacobs
9,077,791 B2* 7/2015 Jeong .................... G06F 1/1637
9,231,640 B2 1/2016 Yoon et al.
(Continued)

FOREIGN PATENT DOCUMENTS

EP 3 079 033 A1 10/2016
KR 10-2015-0023995 3/2015

OTHER PUBLICATIONS

International Search Report dated Apr. 20, 2018 in counterpart International patent application PCT/KR2018/000132.
(Continued)

*Primary Examiner* — Hang Lin
(74) *Attorney, Agent, or Firm* — Nixon & Vanderhye P.C.

(57) ABSTRACT

An example electronic device includes a bracket, a first display including a first display panel and a first window glass disposed to cover the first display panel and having a first edge area, at least a portion of the first edge area being connected to a third edge area of the bracket, and a second display including a second display panel and a second window glass disposed to cover the second display panel and having a second edge area, at least a portion of the second edge area being connected to the third edge area of the bracket. The third edge area of the bracket includes a protruding portion that protrudes a specified distance from a lateral side of the electronic device, and the protruding portion has a thickness smaller than or equal to a specified value.

19 Claims, 12 Drawing Sheets

(56) References Cited

U.S. PATENT DOCUMENTS

| | | | |
|---|---|---|---|
| 9,507,382 B2 | 11/2016 | Lee et al. | |
| 2007/0131944 A1 | 6/2007 | Hu et al. | |
| 2011/0019123 A1* | 1/2011 | Prest | C03C 19/00 |
| | | | 349/58 |
| 2012/0212923 A1 | 8/2012 | Peng et al. | |
| 2013/0113755 A1 | 5/2013 | Kwak et al. | |
| 2013/0140965 A1 | 6/2013 | Franklin et al. | |
| 2013/0342971 A1 | 12/2013 | Jacobs et al. | |
| 2014/0080552 A1 | 3/2014 | Yoon et al. | |
| 2014/0308469 A1* | 10/2014 | Aida | B29C 45/14434 |
| | | | 428/38 |
| 2015/0055292 A1 | 2/2015 | Lee et al. | |
| 2015/0370131 A1* | 12/2015 | Ning | G02F 1/133608 |
| | | | 349/61 |
| 2016/0066440 A1* | 3/2016 | Choi | G06F 1/1637 |
| | | | 361/679.3 |
| 2016/0299627 A1 | 10/2016 | Yang et al. | |

OTHER PUBLICATIONS

Extended European Search Report dated Oct. 25, 2019 for EP Application No. 18736591.1.

* cited by examiner

ELECTRONIC DEVICE

CROSS-REFERENCE TO RELATED APPLICATION(S)

This application is based on and claims the benefit under 35 U.S.C. § 119 of a Korean patent application filed on Jan. 9, 2017 in the Korean Intellectual Property Office and assigned Serial No. 10-2017-0002748, the entire contents of which are incorporated herein by reference.

TECHNICAL FIELD

The present disclosure generally relates to an electronic device.

BACKGROUND

Electronic devices, such as smartphones, may include a display and may provide various types of content to a user through the display. For example, the electronic devices may provide a screen, such as a photographing screen, a movie reproduction screen, or the like, which presents various types of content to a user through the display.

To meet increasing demands for large-screen displays, electronic devices having a screen on a portion of a lateral side or a rear side thereof in addition to a screen on a front, as well as electronic devices having a screen occupying almost the entire front thereof, have been developed and are widely used.

SUMMARY

In the case of an electronic device that includes an upper display occupying the front of the electronic device and a lower display occupying the rear of the electronic device, the displays may be more likely to be damaged by external shocks. Therefore, a support member for absorbing shocks may be provided on an area of the lateral side of the electronic device to which the upper display and the lower display are connected.

However, the area where the support member and the displays are connected may have discontinuous surfaces, which may lead to degradation in a sense of grip when a user holds the electronic device.

Aspects of the present disclosure address at least the above-mentioned problems and/or disadvantages and provide at least the advantages described below. Accordingly, an aspect of the present disclosure is to provide an electronic device for absorbing external shocks, while minimizing an exposed area of a support member that supports an upper display and a lower display.

In accordance with an example aspect of the present disclosure, an electronic device includes a bracket, a first display including a first display panel disposed on a first side of the bracket and a first window glass disposed to cover the first display panel and having a first edge area, at least a portion of the first edge area being connected to a third edge area of the bracket, and a second display including a second display panel disposed on a second side of the bracket that is opposite to the first side and a second window glass disposed to cover the second display panel and having a second edge area, at least a portion of the second edge area being connected to the third edge area of the bracket. The third edge area of the bracket includes a protruding portion that protrudes a specified distance from a lateral side of the electronic device, and the protruding portion has a thickness smaller than or equal to a specified value.

According to example embodiments disclosed herein, by reducing or minimizing discontinuous surfaces in an area extending from an upper display to a lower display, degradation in a sense of grip can be reduced or prevented and damage to a window glass due to external shocks can be reduced or prevented.

In addition, the example embodiments of the present disclosure may provide various effects that are directly or indirectly recognized.

Other aspects, advantages, and salient features of the disclosure will become apparent to those skilled in the art from the following detailed description, which, taken in conjunction with the annexed drawings, discloses various example embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

Throughout the drawings, like reference numbers are used to depict the same or similar elements, features, and structures.

DETAILED DESCRIPTION

Figure 1:
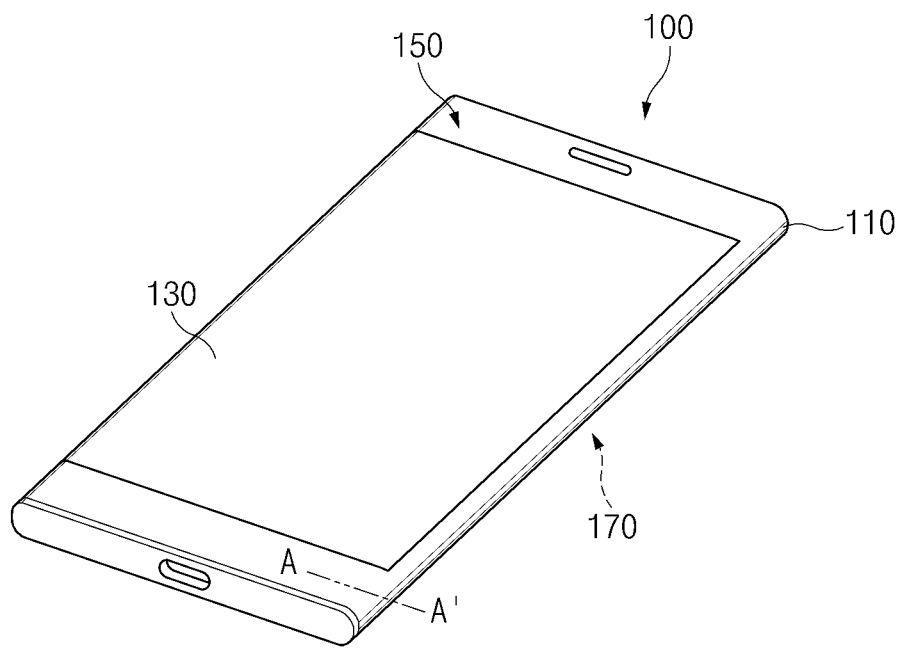
FIG. 1 is a perspective view of an electronic device according to an example embodiment of the present disclosure.

Hereinafter, various example embodiments of the present disclosure are disclosed with reference to the accompanying drawings. However, the present disclosure is not intended to be limited to any specific example embodiment and the present disclosure is intended to cover all modifications, equivalents, and/or alternatives of the example embodiments within the scope of the appended claims and their equivalents.

The terms and words used in the following description and claims are not limited to dictionary definitions, but, are merely used to enable a clear and consistent understanding of the present disclosure. Accordingly, it should be apparent to those skilled in the art that the following description of various example embodiments of the present disclosure is provided for illustration purposes only and not to limit the present disclosure as defined by the appended claims and their equivalents.

The singular forms "a," "an," and "the" are intended to include plural referents unless the context clearly dictates otherwise. Thus, for example, reference to "a component surface" includes reference to one or more of such surfaces.

The terms "include," "comprise," and "have", or "may include," or "may comprise" and "may have" as used herein indicate disclosed functions, operations, or existence of elements but do not exclude other functions, operations or elements.

The expressions "A or B," or "at least one of A and/or B" may indicate A and B, A, or B. For example, the expression "A or B" or "at least one of A and/or B" may indicate (1) at least one A, (2) at least one B, or (3) both at least one A and at least one B.

The terms such as "1st," "2nd," "first," "second," and the like used herein may modify various different elements of various example embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various example embodiments of the present disclosure, when a component (for example, a first component) is referred to as being "operatively or communicatively coupled with/to" or "connected to" another component (for example, a second component), the component may be directly connected to the other component or connected through another component (for example, a third component). In various example embodiments of the present disclosure, when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various example embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of" For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various example embodiments of the present disclosure are used to describe the example embodiments, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various example embodiments of the present disclosure may include, for example and without limitation, at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include, for example and without limitation, at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various example embodiments of the present disclosure, an electronic device may be a home appliance. The smart home appliance may include, for example and without limitation, at least one of a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame.

In other various example embodiments of the present disclosure, an electronic device may include, for example and without limitation, at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various example embodiments of the present disclosure, an electronic device may include, for example and without limitation, at least one of a part of furniture or a building/structure, an electronic board, an electronic signature receiving device, a projector, or a measuring instrument (e.g., a water meter, an electricity meter, a gas meter, a wave meter, or the like). An electronic device may be a combination of one or more of the above-mentioned devices. An electronic device according to some various example embodiments of the present disclosure may be a flexible device. An electronic device according to an example embodiment of the present disclosure is not limited to the above-mentioned devices, and may include new electronic devices with the development of new technology.

Hereinafter, an electronic device according to various example embodiments of the present disclosure will be described in more detail with reference to the accompanying drawings. The term "user" used herein may refer to a person who uses an electronic device or may refer to a device (e.g., an artificial intelligence electronic device) that uses an electronic device.

FIG. 1 is a perspective view of an electronic device according to an example embodiment of the present disclosure.

Referring to FIG. 1, an electronic device 100 may include a bracket 110, an upper display 150, and a lower display 170. However, a configuration of the electronic device 100 is not limited thereto. According to various example embodiments, the electronic device 100 may further include at least one other element, in addition to the aforementioned elements.

The bracket 110 may provide a space in which at least a part of elements of the electronic device 100 is mounted. According to an example embodiment, the bracket 110 may provide a space in which at least one element included in the upper display 150 and the lower display 170 is mounted. For example, the bracket 110 may have a substantially rectangular plate shape when viewed from the front of the electronic device 100, and sidewalls may be disposed on edge areas of the bracket 110 or areas adjacent to the edge areas to form the space between the sidewalls. For example, the bracket 110 may have a first sidewall, a second sidewall, a third sidewall, and a fourth sidewall disposed on a left side, a right side, an upper side, and a lower side thereof, respectively, and a space in which elements of the electronic device 100 are mounted may be formed between the first to fourth sidewalls. However, the shape of the bracket 110 is not limited thereto. According to various example embodiments, at least one of the aforementioned sidewalls may be omitted. Furthermore, the bracket 110 may have an area on which an adhesive material is coated or an adhesive layer is stacked, to fix elements mounted on the bracket 110.

According to various example embodiments, the bracket 110 may include at least one opening. The opening may be a passage through which elements mounted on both sides of the bracket 110 are electrically connected together. For example, the elements (e.g., the upper display 150 and the lower display 170) mounted on both the sides of the bracket 110 may be connected to a printed circuit board mounted on at least one side of the bracket 110 through the opening. The number, shape, or position of openings may vary depending on the number, shape, or position of elements mounted on the bracket 110.

Although not illustrated in FIG. 1, the printed circuit board mounted on the bracket 110 may have various types of electronic components mounted thereon. For example, at least one electronic element, circuit line, or the like may be mounted on the printed circuit board, and at least some of the electronic components may be electrically connected together. The electronic components may include, for example, a processor, a memory, a communication circuit, a function module (e.g., a camera or a speaker), and/or the like.

The printed circuit board may be integrally formed with the bracket 110, and a plurality of printed circuit boards may be provided. For example, a first printed circuit board may be disposed on the top side of the bracket 110, and a second printed circuit board may be disposed on the bottom side of the bracket 110. In another example embodiment, the first and second printed circuit boards may be disposed on the same side of the bracket 110 and may be electrically connected with other elements of the electronic device 100 through the opening formed in the bracket 110.

A display (e.g., the upper display 150 and the lower display 170) may display (output) various types of content (e.g., text, an image, audio, video, an icon, a symbol, and/or the like) for a user. Examples of the display may include, for example and without limitation, a liquid crystal display (LCD), a light-emitting diode (LED) display, an organic light-emitting diode (OLED) display, a microelectromechanical systems (MEMS) display, or an electronic paper display. According to an example embodiment, the display may include a touch screen and may receive, for example, a touch input, a gesture input, a proximity input, or a hovering input using an electronic pen or a part of a user's body.

The display (e.g., the upper display 150 and the lower display 170) may have a plurality of layers. For example, the display may include a cover layer, a touch detection layer, a display layer, or the like. However, a configuration of the display is not limited thereto. According to various example embodiments, the display may not include at least one of the aforementioned layers and may further include at least one other layer (e.g., a pressure detection layer, an antenna layer, a fingerprint recognition layer, or the like).

The cover layer may be disposed on the exterior of the display to protect elements of the display from the outside. For example, the cover layer may be disposed to cover the display layer (e.g., an upper display panel 130). For example, the cover layer may form the external appearance of the electronic device 100. According to an example embodiment, at least an area of the cover layer may be formed of a transparent material (e.g., glass), and a screen output through the display layer may be displayed to the outside through the transparent area of the cover layer. In the case in which the cover layer is formed of glass, the cover layer may be referred to as a window glass.

The touch detection layer may include, for example, a touch sensor for detecting contact or access of a touch object (e.g., an electronic pen or a part of a user's body). According to an example embodiment, the touch detection layer may have a panel form, in which case the touch detection layer may be referred to as a touch panel. The touch sensor may include a conductive material and may be arranged on the touch panel in the horizontal (or X-axis) and vertical (Y-axis) directions to form a grid structure.

The display layer may have a panel form and may be referred to as a display panel (e.g., the upper display panel 130). The display panel may have a different structure and shape depending on a method of implementing a color. The display panel may include a polymer layer, a plurality of display elements mounted on one side of the polymer layer, and at least one conductive line combined with the polymer layer and electrically connected with the plurality of display elements. According to an example embodiment, the polymer layer may include polyimide. The plurality of display elements may be arranged in a matrix form on one side of the polymer layer to form pixels of the display panel and may include fluorescent materials or organic fluorescent materials for representing colors. According to an example embodiment, the plurality of display elements may include an organic light-emitting diode (OLED). The conductive line may include at least one gate signal line or at least one data signal line. According to an example embodiment, a plurality of gate signal lines and a plurality of data signal lines may be arranged in a matrix form, and the plurality of display elements may be disposed adjacent to points where the signal lines cross one another and may be electrically connected to the signal lines.

According to various example embodiments, the display panel may be connected with a display driver IC (DDI). The display driver IC may be electrically connected with the conductive line. The display driver IC may include a driver IC for providing a driving signal and an image signal to the display layer or a timing controller (T-con) for controlling the driving signal and the image signal. The driver IC may include a gate driver IC for sequentially selecting the gate signal lines of the display panel to apply a scan signal (or a driving signal) and a data driver IC (or a source driver IC) for applying an image signal to the data signal lines of the display panel. According to an example embodiment, if the gate driver IC selects the gate signal line and applies a scan signal to the gate signal line to activate the corresponding display element, the data driver IC may apply an image signal to the corresponding display element through the data signal line. The timing controller may control transmission time of a signal transmitted to the driver IC to prevent a difference in display time, which may occur in the process in which a screen is output on the display panel.

At least one of the upper display 150 and the lower display 170 may include an area with a curved surface. For example, the upper display 150 may have left and right edge areas curved downwards (or in the direction toward the bracket 110), and the lower display 170 may have left and right edge areas curved upwards (or in the direction toward the bracket 110).

According to an example embodiment, the upper display 150 may be fixedly mounted on the top side of the bracket 110, and the lower display 170 may be fixedly mounted on the bottom side of the bracket 110. For example, the bracket 110 may function as a support member that supports the upper display 150 and the lower display 170. For example, the left and right edge areas of the upper display 150 may be connected to edge areas of the top side of the bracket 110, and the left and right edge areas of the lower display 170 may be connected to edge areas of the bottom side of the bracket 110. In this case, the edge areas of the bracket 110 to which the upper display 150 and the lower display 170 are connected may be partly exposed to the outside. Accordingly, the outer side surfaces of the upper display 150, the side surfaces of the bracket 110, and the outer side surfaces of the lower display 170 may form a lateral side of the electronic device 100.

According to an example embodiment, discontinuous surfaces may be formed in areas where the outer side surfaces of the upper display 150, the side surfaces of the bracket 110, and the outer side surfaces of the lower display 170 are connected together. Due to the discontinuous surfaces, a sense of grip may be degraded when a user holds the electronic device 100. Accordingly, the side surfaces of the bracket 110 exposed to the outside may preferably have a minimal area to allow the user to recognize the discontinuous surfaces as substantially continuous surfaces. Furthermore, the bracket 110, which supports the upper display 150 and the lower display 170, may advantageously have a central area with a large volume to prevent the window glass of the upper display 150 and the window glass of the lower display 170 from being damaged by external shocks. For example, the possibility of damage to the window glass may be lowered with an increase in the central area of the bracket 110 where an external force is transmitted and dispersed.

Figure 2:
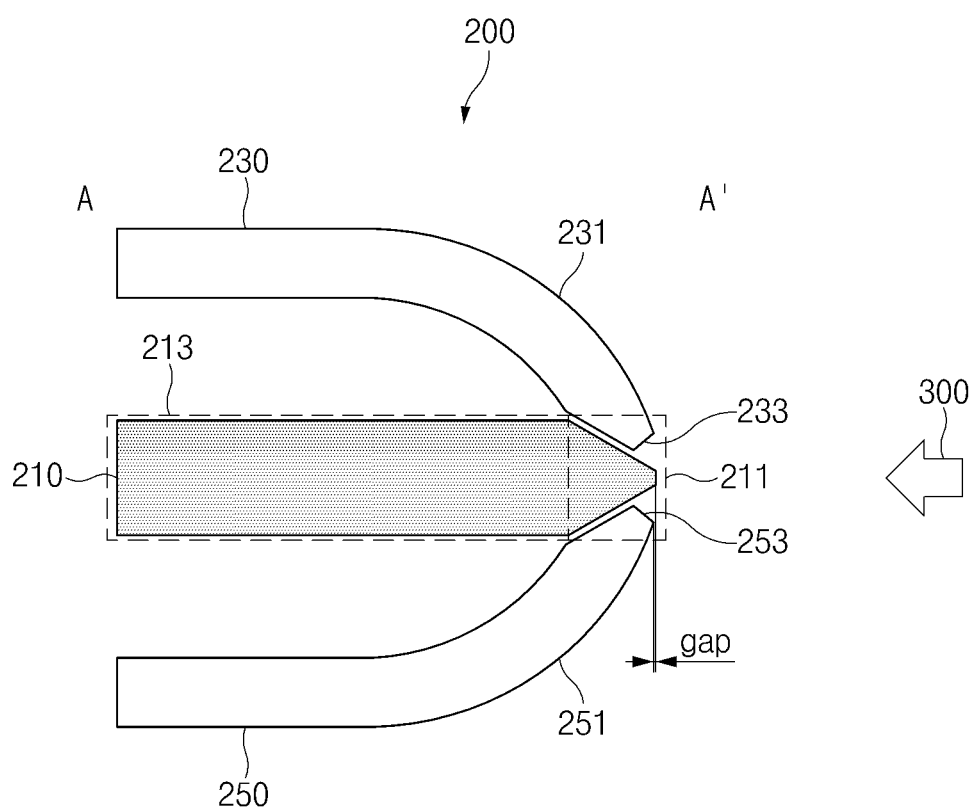
FIG. 2 is a sectional view taken along line A-A' of FIG. 1.
Figure 3:
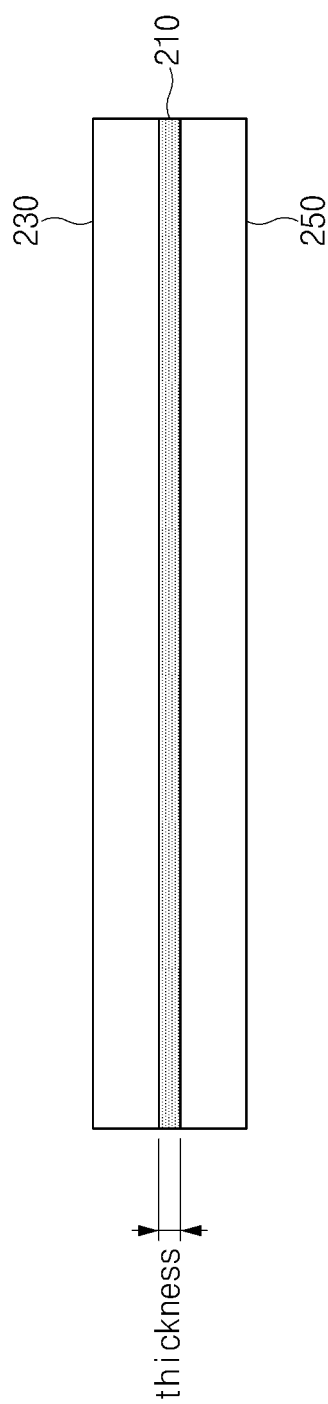
FIG. 3 is a side view of the section illustrated in FIG. 2.

FIG. 2 is a sectional view taken along line A-A' of FIG. 1 and FIG. 3 is a side view of the section illustrated in FIG. 2.

Referring to FIGS. 2 and 3, an electronic device 200 (e.g., the electronic device 100) may include a bracket 210, an upper display, and a lower display. Although only the bracket 210, a window glass 230 (hereinafter, referred to as an upper window glass) of the upper display, and a window glass 250 (hereinafter, referred to as a lower window glass) of the lower display are illustrated in FIGS. 2 and 3, a configuration of the electronic device 200 is not limited thereto. The electronic device 200 may further include a printed circuit board disposed on at least one side of the bracket 210, as well as a display panel disposed below the window glass of each display.

According to an example embodiment, the upper window glass 230 and the lower window glass 250 may have edge areas curved toward the bracket 210, and distal ends of the curved edge areas may be connected to upper and lower ends of edge areas 211 of the bracket 210. For example, the upper window glass 230 may have edge areas 231 curved downwards, and an inner side surface of a distal end 233 of each curved edge area 231 may be connected to an upper end of the corresponding edge area 211 of the bracket 210. The lower window glass 250 may have edge areas 251 curved upwards, and an inner side surface of a distal end 253 of each curved edge area 251 may be connected to a lower end of the edge area 211 of the bracket 210. In another example embodiment, the distal ends of the curved edge areas of each window glass may be chamfered. For example, an outer side surface of the distal end 233 of the upper window glass 230 and an outer side surface of the distal end 253 of the lower window glass 250 may be chamfered.

According to an example embodiment, a portion of the edge area 211 of the bracket 210 (e.g., a side surface of the bracket 210) that is exposed to the outside may have an area (or a thickness) smaller than or equal to a specified value. For example, discontinuous surfaces formed in an area extending from the outer side surface of the upper window glass 230 to the outer side surface of the lower window glass 250 may be reduced or minimized such that the exposed portion of the edge area 211 of the bracket 210 is reduced or minimized. For example, the edge area 211 of the bracket 210 may have a gradually decreasing cross-sectional area (e.g., thickness) away from a central area 213 of the bracket 210 (e.g., may be tapered).

According to an example embodiment, the central area 213 of the bracket 210 may have a larger volume than the edge area 211 of the bracket 210. For example, when external shocks are applied, an external force (e.g., a transverse force 300) may be transmitted to and dispersed over the central area 213 of the bracket 210, and thus the possibility of damage to each window glass may be lowered. For example, the central area 213 of the bracket 210 may have a larger cross-sectional area than the edge area 211 of the bracket 210. Since the central area 213 of the bracket 210 has a cross-sectional area greater than or equal to a specified value, the bending stiffness of the electronic device 200 (e.g., a property to keep the original shape of the electronic device 200 even though an external force is applied to the electronic device 200) may be ensured.

According to an example embodiment, the edge area 211 of the bracket 210 may protrude a specified distance (e.g., gap) from the lateral side of the electronic device 200. For example, the edge area 211 of the bracket 210 may further protrude in the lateral direction of the electronic device 200 by the specified distance beyond a virtual line that connects an end portion of the outer side surface of the upper window glass 230 and an end portion of the outer side surface of the lower window glass 250. Since the edge area 211 of the bracket 210 protrudes outward, the protruding edge area 211 of the bracket 210 may be more likely to preferentially hit or impact the ground when the electronic device 200 drops.

According to an example embodiment, an area of the bracket 210 may be formed of metal. For example, the edge area 211 of the bracket 210 may include a metal material. However, the bracket 210 is not limited thereto. In an example embodiment, only the exposed portion of the edge area 211 of the bracket 210 may include a metal material.

Figure 4:
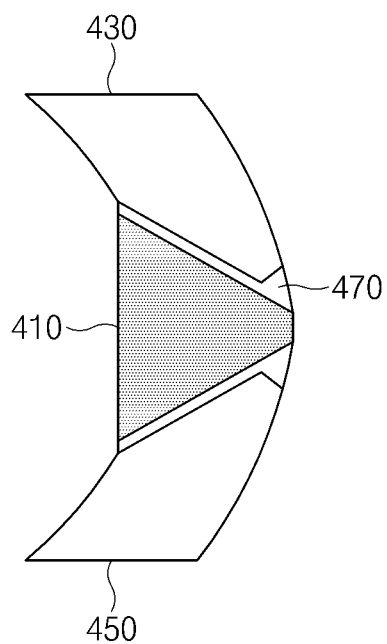
FIG. 4 is a diagram illustrating a form in which a reinforcing member is added to a connecting area, according to an example embodiment of the present disclosure.

FIG. 4 is a diagram illustrating a form in which a reinforcing member is added to a connecting area, according to an example embodiment.

Referring to FIG. 4, a reinforcing member 470 may be additionally disposed between an upper window glass 430 and a bracket 410 and between a lower window glass 450 and the bracket 410 to reinforce an area to which an external force is applied (e.g., an area where an electronic device hits or impacts the ground when the electronic device drops) when the external force is applied to the bracket 410 disposed between the upper window glass 430 and the lower window glass 450. The reinforcing member 470 may not only reinforce the area to which the external force is applied, but may also enhance a sense of grip. For example, the reinforcing member 470 may prevent a discontinuous surface from being formed in an area extending from an outer side surface of the upper window glass 430 to an outer side surface of the lower window glass 450. For example, the reinforcing member 470 may fill a space between the upper window glass 430 and the bracket 410 (e.g., a first reinforcing member) to form a curved surface smoothly extending from the outer side surface of the upper window glass 430 to a protruding side surface of the bracket 410. Furthermore, the reinforcing member 470 may fill a space between the lower window glass 450 and the bracket 410 (e.g., a second reinforcing member) to form a curved surface smoothly extending from the outer side surface of the lower window glass 450 to the protruding side surface of the bracket 410. Consequently, one curved surface may be formed that includes the outer side surface of the upper window glass 430, the outer side surface of the reinforcing member 470 (e.g., the first reinforcing member), the side surface of the bracket 410, the outer side surface of the reinforcing member 470 (e.g., the second reinforcing member), and the outer side surface of the lower window glass 450.

According to an example embodiment, the reinforcing member 470 may also perform a water-proofing function. For example, the reinforcing member 470 may implement a waterproofing function by filling the space between the upper window glass 430 and the bracket 410 and the space between the lower window glass 450 and the bracket 410. In an example embodiment, the reinforcing member 470 may be formed of a waterproof material.

According to an example embodiment, the reinforcing member 470 may also be formed of a material similar to glass. For example, the reinforcing member 470 may be formed of an inorganic material, a transparent/translucent polymer, or the like. Accordingly, the electronic device (e.g., the electronic device 100) may be recognized as if the electronic device is formed of substantially the same material (e.g., glass) in external appearance.

Figure 5A:
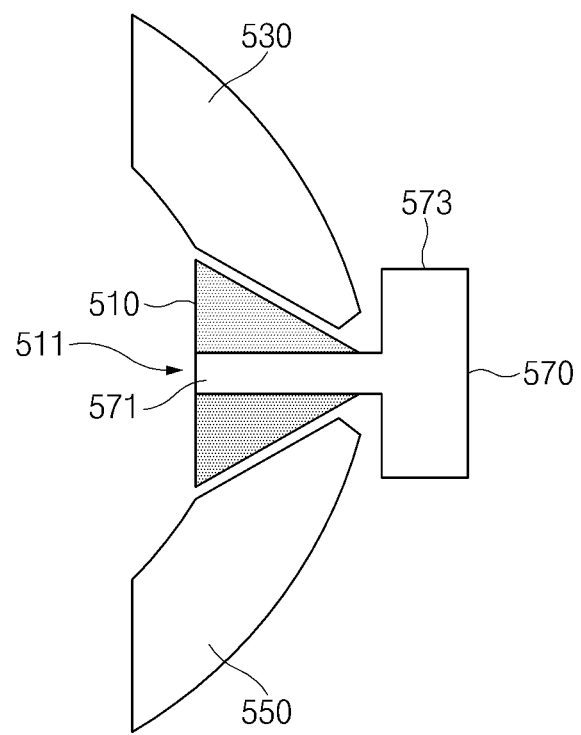
FIG. 5A is a diagram illustrating a form in which a physical key is disposed in a connecting area, according to an example embodiment of the present disclosure.
Figure 5B:
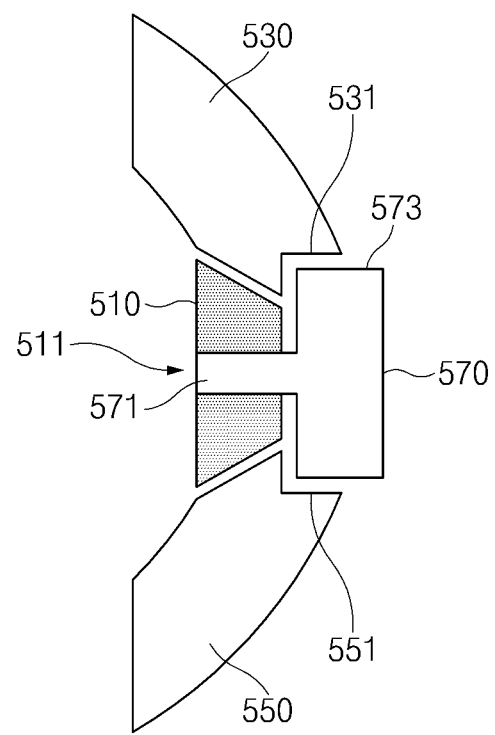
FIG. 5B is a diagram illustrating another form in which a physical key is disposed in a connecting area, according to an example embodiment of the present disclosure.

FIG. 5A is a diagram illustrating a form in which a physical key is disposed in a connecting area, according to an example embodiment. FIG. 5B is a diagram illustrating another form in which a physical key is disposed in a connecting area, according to an example embodiment.

Referring to FIGS. 5A and 5B, a bracket 510 disposed between an upper window glass 530 and a lower window glass 550 may include a through-hole 511 formed through an outer side surface and an inner side surface of the bracket 510. A physical key 570 may be fixedly inserted into the through-hole 511. For example, an insertion part 571 extending from a contact part 573 of the physical key 570 may be inserted into the through-hole 511. The contact part 573 of the physical key 570 may protrude from the outer side surface of the bracket 510 and may thus be more likely to preferentially hit or impact the ground when an electronic device drops.

For example, when a user presses the contact part 573, the pressed contact part 573 of the physical key 570 may move toward the inside of the electronic device (e.g., the electronic device 100), and a switch module brought into contact with the contact part 573 of the physical key 570 by the movement of the physical key 570 may operate to generate an electrical signal. In response to the generated electrical signal, the electronic device may perform a function relating to an input of the physical key 570. For example, in response to the input of the physical key 570, the electronic device may perform a function of turning on/off a screen of a display, adjusting call volume, adjusting volume by which a multi-media file is reproduced, or the like.

According to an example embodiment, as illustrated in FIG. 5B, a portion the contact part 573 of the physical key 570 may be inserted into the electronic device. For example, a portion of an edge area of the upper window glass 530 and a portion of an edge area of the lower window glass 550 may be recessed toward the inside of the electronic device. Accordingly, the outer side surface of the upper window glass 530 and the outer side surface of the lower window glass 550 may have a step, and the outer side surface of the bracket 510 may be arranged with the stepped outer side surfaces in the same plane. The contact part 573 of the physical key 570 may be mounted in the recessed area. Sidewalls of the recessed area (e.g., a first sidewall 531 formed on the upper window glass 530 and a second sidewall 551 formed on the lower window glass 550) may be spaced apart from side surfaces of the contact part 573 of the physical key 570 by a predetermined distance, and due to the separation space, the contact part 573 of the physical key 570 may move leftwards and rightwards.

Figure 6:
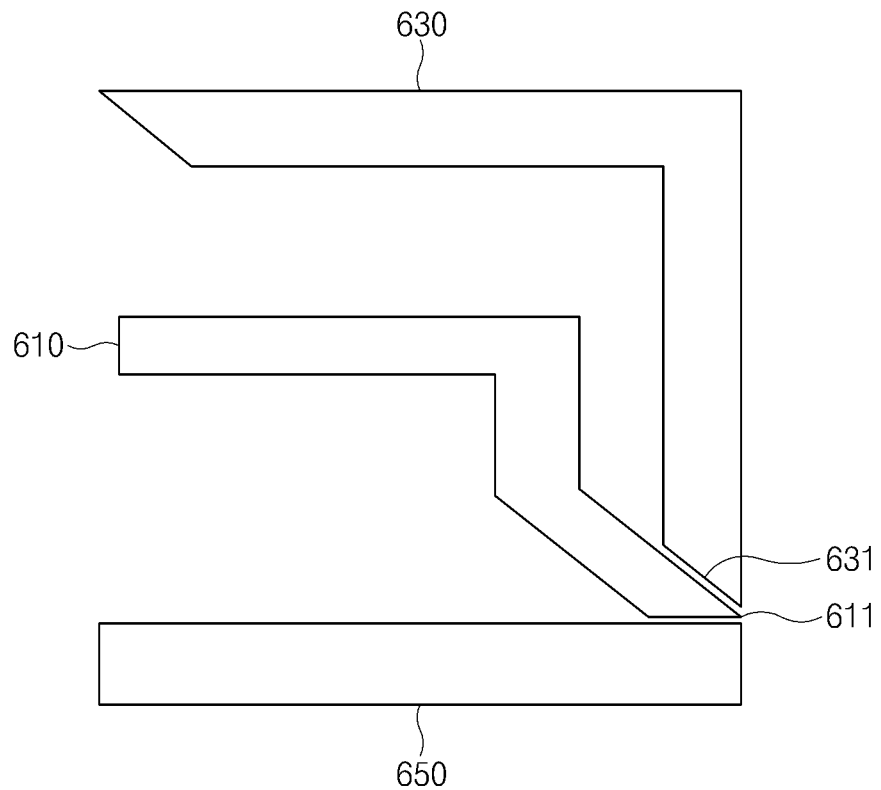
FIG. 6 is a diagram illustrating a bracket according to another example embodiment of the present disclosure.

FIG. 6 is a diagram illustrating a bracket according to another example embodiment.

Referring to FIG. 6, the external appearance of an electronic device (e.g., the electronic device 100) formed by an upper window glass 630 and a lower window glass 650 may be a substantially rectangular parallelepiped. In this case, as illustrated in FIG. 6, the electronic device may have an overall rectangular cross section. Furthermore, the upper window glass 630 may form a front side and a lateral side of the electronic device, and the lower window glass 650 may form a rear side of the electronic device. However, the upper window glass 630 and the lower window glass 650 are not limited thereto. In an example embodiment, the upper window glass 630 may form a front side of the electronic device, and the lower window glass 650 may form a lateral side and a rear side of the electronic device.

To form the lateral side of the electronic device, the upper window glass 630 (or the lower window glass 650) may be bent at an area connecting the front side (or the rear side) and the lateral side of the electronic device. Furthermore, the bent upper window glass 630 (or the bent lower window glass 650) may face the lower window glass 650 (or the upper window glass 630), which has a plate shape, at a lower end (or an upper end) of the lateral side of the electronic device. Accordingly, an edge area 611 of a bracket 610 may be disposed at the lower end (or the upper end) of the lateral side of the electronic device and may be connected with an edge area of the upper window glass 630 and an edge area of the lower window glass 650.

The bracket 610 may have a shape other than a long plate shape to dispose the edge area 611 of the bracket 610 at the lower end (or the upper end) of the lateral side of the electronic device. For example, the bracket 610 may have a shape in which an area (hereinafter, referred to as a connecting area) that connects a central area and the edge area 611 is bent, as illustrated in FIG. 6. The central area of the bracket 610 may have a long plate shape and may be disposed in the middle of the electronic device, and the connecting area extending from the central area may be bent toward the lower end (or the upper end) of the electronic device and may be connected to the edge area 611. FIG. 6 illustrates that the connecting area extends from the central area toward the lower end of the electronic device and is connected to the edge area 611. In this case, the edge area 611 of the bracket 610 may be inclined at a specified angle with respect to the lower window glass 650. For example, the edge area 611 may be obliquely disposed in the direction from the connecting area to the lower end of the lateral side of the electronic device. However, an arrangement of the edge area 611 is not limited thereto. In an example embodiment, the connecting area may extend from the central area so as to be adjacent to an inner side surface of the lower window glass 650, and the edge area 611 may be arranged substantially parallel to the lower window glass 650.

Figure 7A:
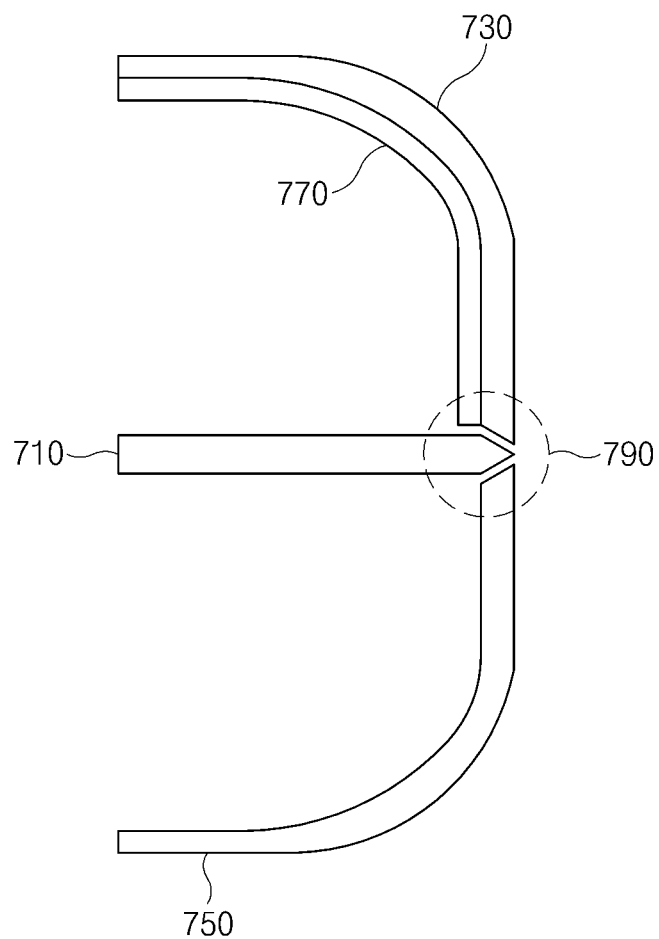
FIG. 7A is a diagram illustrating an arrangement of a display panel and a bracket, according to an example embodiment of the present disclosure.

FIG. 7A is a diagram illustrating an arrangement of a display panel and a bracket, according to an example embodiment.

Referring to FIG. 7A, an electronic device (e.g., the electronic device 100) may include a bracket 710, an upper window glass 730, and a lower window glass 750. The bracket 710 may be disposed between the upper window glass 730 and the lower window glass 750 and may provide a space in which elements of the electronic device are mounted. The bracket 710 may have an area on which an adhesive material is coated or an adhesive layer is stacked, to fix the mounted elements of the electronic device.

According to an example embodiment, an upper display panel 770 and a lower display panel (not illustrated) may be disposed on the inside of the upper window glass 730 and the inside of the lower window glass 750, respectively. Furthermore, at least one of the upper display panel 770 and the lower display panel may be bent along an inner side surface of the corresponding window glass to allow a screen to be output in the lateral direction of the electronic device. For example, the upper display panel 770 may have a shape in which an edge area is curved toward the lower end of the electronic device along an inner side surface of the upper window glass 730.

According to an example embodiment, the bracket 710 may absorb shocks occurred on an area 790 of the lateral side of the electronic device to which the upper window glass 730 and the lower window glass 750 are connected.

Figure 7B:
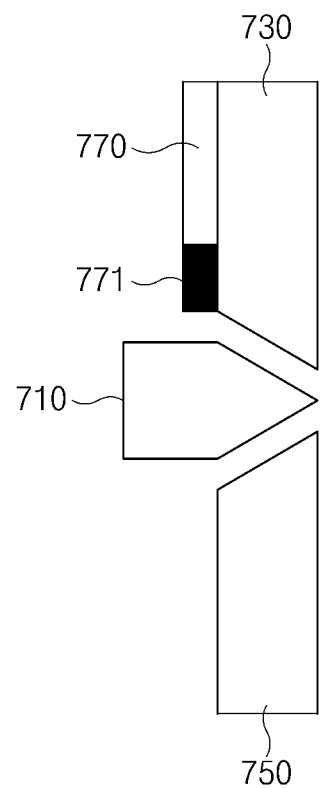
FIG. 7B is a diagram illustrating a first arrangement of a non-active area of a display panel, according to an example embodiment of the present disclosure.
Figure 7C:
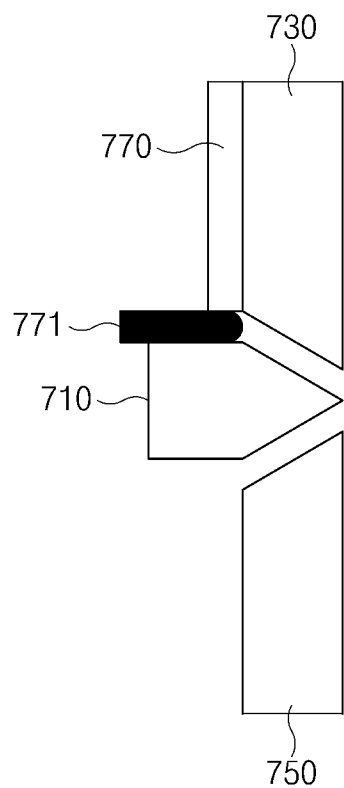
FIG. 7C is a diagram illustrating a second arrangement of a non-active area of a display panel, according to an example embodiment of the present disclosure.
Figure 7D:
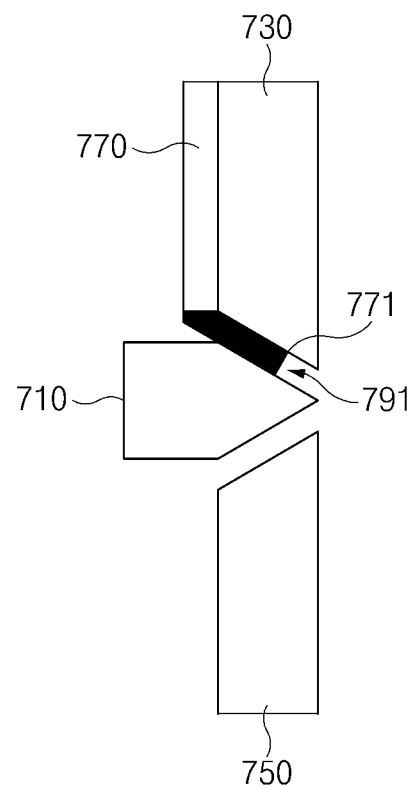
FIG. 7D is a diagram illustrating a third arrangement of a non-active area of a display panel, according to an example embodiment of the present disclosure.
Figure 7E:
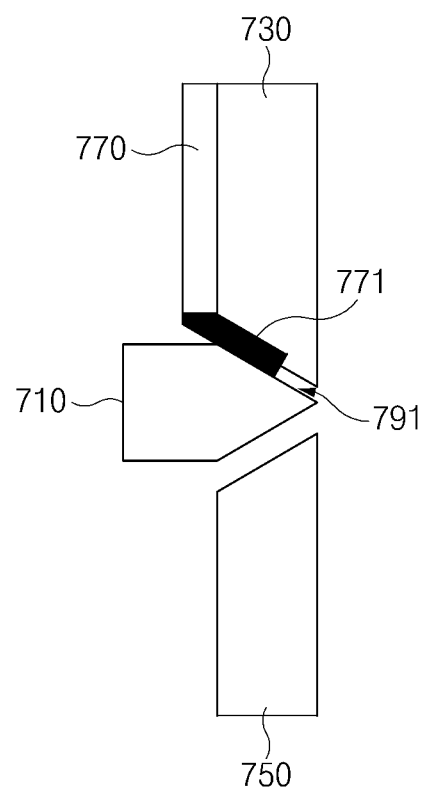
FIG. 7E is a diagram illustrating a fourth arrangement of a non-active area of a display panel, according to an example embodiment of the present disclosure.

FIG. 7B is a diagram illustrating a first arrangement of a non-active area of a display panel, according to an example embodiment. FIG. 7C is a diagram illustrating a second arrangement of a non-active area of a display panel, according to an example embodiment. FIG. 7D is a diagram illustrating a third arrangement of a non-active area of a display panel, according to an example embodiment. FIG. 7E is a diagram illustrating a fourth arrangement of a non-active area of a display panel, according to an example embodiment.

Referring to FIGS. 7B to 7E, a display panel disposed on the inside of a window glass may include a non-active area 771 (e.g., a BM area). For example, as illustrated in FIG. 7B, the non-active area 771 may be included in a portion of the edge area of the upper display panel 770 (and/or the lower display panel (not illustrated)) disposed on the inside of the upper window glass 730 (and/or the lower window glass 750).

According to an example embodiment, to minimize exposure of the non-active area 771 to the outside, a relatively long portion of the non-active area 771 may be arranged substantially parallel to one side of the bracket 710 in a cross-section, as illustrated in FIG. 7C. In another example, as illustrated in FIG. 7D, the non-active area 771 may be disposed in a gap 791 formed between an edge area of the bracket 710 and a window glass (e.g., the upper window glass 730). In this case, the non-active area 771 may be disposed on an inclined surface formed on the edge area of the bracket 710. In another example, as illustrated in FIG. 7E, the non-active area 771 may be disposed in the gap 791 formed between the edge area of the bracket 710 and a window glass (e.g., the upper window glass 730), and a portion of the non-active area 771 may be inserted into an inner side surface of the window glass.

According to various example embodiments, a printed layer (not illustrated) may be additionally formed between the non-active area 771 and the window glass to prevent the non-active area 771 from being exposed outside the electronic device.

As described above, according to various example embodiments, an electronic device may include a bracket, a first display including a first display panel disposed on a first side of the bracket and a first window glass disposed to cover the first display panel and having a first edge area, at least a portion of the first edge area being connected to a third edge area of the bracket, and a second display including a second display panel disposed on a second side of the bracket that is opposite to the first side and a second window glass disposed to cover the second display panel and having a second edge area, at least a portion of the second edge area being connected to the third edge area of the bracket. The third edge area of the bracket may include a protruding portion that protrudes a specified distance from a lateral side of the electronic device, and the protruding portion may have a thickness smaller than or equal to a specified value.

According to various example embodiments, the third edge area of the bracket may have a smaller cross-sectional area than a central area of the bracket.

According to various example embodiments, the third edge area of the bracket may have a gradually decreasing cross-sectional area away from a central area of the bracket.

According to various example embodiments, at least one of the first edge area of the first window glass and the second edge area of the second window glass may be chamfered.

According to various example embodiments, the electronic device may further include at least one of a first reinforcing member disposed between the third edge area of the bracket and the first window glass and a second reinforcing member disposed between the third edge area of the bracket and the second window glass.

According to various example embodiments, the first reinforcing member may extend from an outer side surface of the first window glass to an outer side surface of the protruding portion of the bracket, and the second reinforcing member may extend from an outer side surface of the second window glass to the outer side surface of the protruding portion of the bracket.

According to various example embodiments, at least one of the first reinforcing member and the second reinforcing member may be formed of a waterproof material.

According to various example embodiments, the first reinforcing member may be formed of a material similar to a material of the first window glass, and the second reinforcing member may be formed of a material similar to a material of the second window glass.

According to various example embodiments, the electronic device may further include a through-hole formed through an outer side surface of the protruding portion of the bracket and an inner side surface of the protruding portion of the bracket. A first portion of a physical key may be inserted into the through-hole.

According to various example embodiments, the first edge area of the first window glass may include a first recessed portion that is recessed inward from the lateral side of the electronic device such that the first edge area of the first window glass is stepped, and the second edge area of the second window glass may include a second recessed portion that is recessed inward from the lateral side of the electronic device such that the second edge area of the second window glass is stepped. The outer side surface of the bracket may be arranged with an outer side surface of the first recessed portion of the first window glass and an outer side surface of the second recessed portion of the second window glass in the same plane, and a second portion of the physical key may be mounted on the first recessed portion of the first window glass and the second recessed portion of the second window glass.

According to various example embodiments, a first sidewall formed on the first recessed portion of the first window glass and a second sidewall formed on the second recessed portion of the second window glass may be spaced apart from a side surface of the physical key by a specified distance.

According to various example embodiments, at least one of the first edge area of the first window glass and the second edge area of the second window glass may include a curved portion that is curved toward the bracket.

According to various example embodiments, the first window glass may include a first plate substantially parallel to the first side of the bracket and a second plate bent from the first plate and extending toward the bracket. The second window glass may include a third plate substantially parallel to the second side of the bracket. The third edge area of the bracket may be disposed between the second plate of the first window glass and the third plate of the second window glass.

According to various example embodiments, a central area of the bracket may have a plate shape, and a connecting area of the bracket that connects the central area of the bracket and the third edge area of the bracket may be bent toward the third plate of the second window glass.

According to various example embodiments, the connecting area of the bracket may extend from the central area of the bracket so as to be adjacent to an inner side surface of the third plate of the second window glass, and the third edge area of the bracket may be arranged substantially parallel to the third plate of the second window glass.

According to various example embodiments, the electronic device may further include at least one of a first non-active area disposed on an fourth edge area of the first display panel and a second non-active area disposed on an fifth edge area of the second display panel.

According to various example embodiments, at least one of the first non-active area and the second non-active area may have a relatively long portion arranged substantially parallel to one side of the bracket in a cross-section.

According to various example embodiments, the first non-active area may be disposed in a first gap formed between the third edge area of the bracket and the first window glass, and the second non-active area may be disposed in a second gap formed between the third edge area of the bracket and the second window glass.

According to various example embodiments, a portion of the first non-active area may be inserted into an inner side surface of the first window glass, and a portion of the second non-active area may be inserted into an inner side surface of the second window glass.

According to various example embodiments, the electronic device may further include at least one of a first printed layer disposed between the first non-active area and the first window glass and a second printed layer disposed between the second non-active area and the second window glass.

The term "module" used herein may represent, for example, a unit including one of hardware, software and firmware or a combination thereof. The term "module" may be interchangeably used with the terms "unit", "logic", "logical block", "component" and "circuit". The "module" may refer to a minimum unit of an integrated component or may be a part thereof. The "module" may refer to a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various example embodiments of the present disclosure may be implemented as instructions stored in a non-transitory computer-readable storage medium in the form of a program module. In a case in which the instructions are performed by a processor, the processor may perform functions corresponding to the instructions.

A non-transitory computer-readable recording medium may include, for example and without limitation, a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various example embodiments of the present disclosure and vice versa.

A module or a program module according to various example embodiments of the present disclosure may include at least one of the above-mentioned elements, or some elements may be omitted or other additional elements may be added. Operations performed by the module, the program module or other elements according to various example embodiments of the present disclosure may be performed in a sequential, parallel, iterative or heuristic way. Furthermore, some operations may be performed in another order or may be omitted, or other operations may be added.

While the present disclosure has been shown and described with reference to various example embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a bracket;
   a first display including a first display panel disposed on a first side of the bracket and a first window glass disposed to cover the first display panel and having a first edge area, an inner surface of the first window glass facing the first display panel, at least a portion of the first edge area being connected to a third edge area of the bracket;
   a second display including a second display panel disposed on a second side of the bracket that is opposite to the first side and a second window glass disposed to cover the second display panel and having a second edge area, an inner surface of the second window glass facing the second display panel, at least a portion of the second edge area being connected to the third edge area of the bracket; and,
   a physical key; and
   wherein the third edge area of the bracket includes a protruding portion that protrudes a specified distance from a lateral side of the electronic device,
   wherein the protruding portion has a thickness smaller than or equal to a specified value,
   wherein at least one of the first window glass or the second window glass is bent inwardly toward the bracket proximate the third edge area of the bracket and a periphery of the electronic device, and
   a through-hole formed through an outer side surface of the protruding portion of the bracket and an inner side surface of the protruding portion of the bracket, and wherein a portion of the physical key is disposed in the through-hole.

2. The electronic device of claim 1, wherein the third edge area of the bracket has a smaller cross-sectional area than a cross-section area of a central area of the bracket.

3. The electronic device of claim 1, wherein the third edge area of the bracket has a gradually decreasing cross-sectional area in a direction away from a central area of the bracket.

4. The electronic device of claim 1, wherein at least one of the first edge area of the first window glass and the second edge area of the second window glass is chamfered.

5. The electronic device of claim 1, further comprising:
   at least one of a first reinforcing member disposed between the third edge area of the bracket and the first window glass and a second reinforcing member disposed between the third edge area of the bracket and the second window glass.

6. The electronic device of claim 5, wherein the first reinforcing member extends from an outer side surface of the first window glass to an outer side surface of the protruding portion of the bracket, and
   wherein the second reinforcing member extends from an outer side surface of the second window glass to the outer side surface of the protruding portion of the bracket.

7. The electronic device of claim 5, wherein at least one of the first reinforcing member and the second reinforcing member is formed of a waterproof material.

8. The electronic device of claim 5, wherein the first reinforcing member is formed of a material similar to a material of the first window glass, and
   wherein the second reinforcing member is formed of a material similar to a material of the second window glass.

9. The electronic device of claim 1, wherein the first edge area of the first window glass includes a first recessed portion that is recessed inward from a lateral side of the electronic device such that the first edge area of the first window glass is stepped,
   wherein the second edge area of the second window glass includes a second recessed portion that is recessed inward from the lateral side of the electronic device such that the second edge area of the second window glass is stepped,
   wherein the outer side surface of the bracket is arranged with an outer side surface of the first recessed portion of the first window glass and an outer side surface of the second recessed portion of the second window glass in the same plane, and
   wherein another portion of the physical key is mounted on the first recessed portion of the first window glass and the second recessed portion of the second window glass.

10. The electronic device of claim 9, wherein a first sidewall formed on the first recessed portion of the first window glass and a second sidewall formed on the second recessed portion of the second window glass are spaced apart from a side surface of the physical key by a specified distance.

11. The electronic device of claim 1, wherein at least one of the first edge area of the first window glass and the second edge area of the second window glass includes a curved portion that is curved toward the bracket.

12. The electronic device of claim 1, wherein the first window glass includes a first plate substantially parallel to the first side of the bracket and a second plate bent from the first plate and extending toward the bracket,
   wherein the second window glass includes a third plate substantially parallel to the second side of the bracket, and
   wherein the third edge area of the bracket is disposed between the second plate of the first window glass and the third plate of the second window glass.

13. The electronic device of claim 12, wherein a central area of the bracket has a plate shape, and wherein a connecting area of the bracket that connects the central area of the bracket and the third edge area of the bracket is bent toward the third plate of the second window glass.

14. The electronic device of claim 13, wherein the connecting area of the bracket extends from the central area of the bracket so as to be adjacent to an inner side surface of the third plate of the second window glass, and wherein the third edge area of the bracket is arranged substantially parallel to the third plate of the second window glass.

15. The electronic device of claim 1, further comprising:

at least one of a first non-active area disposed on a fourth edge area of the first display panel and a second non-active area disposed on a fifth edge area of the second display panel.

16. The electronic device of claim 15, wherein at least one of the first non-active area and the second non-active area has a relatively long portion arranged substantially parallel to one side of the bracket in a cross-section.

17. The electronic device of claim 15, wherein the first non-active area is disposed in a first gap formed between the third edge area of the bracket and the first window glass, and wherein the second non-active area is disposed in a second gap formed between the third edge area of the bracket and the second window glass.

18. The electronic device of claim 17, wherein a portion of the first non-active area is disposed in an inner side surface of the first window glass, and wherein a portion of the second non-active area is disposed in an inner side surface of the second window glass.

19. The electronic device of claim 15, further comprising:

at least one of a first printed layer disposed between the first non-active area and the first window glass and a second printed layer disposed between the second non-active area and the second window glass.

* * * * *